(12) United States Patent
Zhang et al.

(10) Patent No.: US 12,324,331 B2
(45) Date of Patent: Jun. 3, 2025

(54) DISPLAY PANEL AND DISPLAY DEVICE

(71) Applicant: BOE TECHNOLOGY GROUP CO., LTD., Beijing (CN)

(72) Inventors: Xing Zhang, Beijing (CN); Pan Xu, Beijing (CN); Dacheng Zhang, Beijing (CN); Ying Han, Beijing (CN); Guoying Wang, Beijing (CN); Zhan Gao, Beijing (CN); Chengyuan Luo, Beijing (CN); Yi Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/790,623

(22) PCT Filed: Aug. 23, 2021

(86) PCT No.: PCT/CN2021/114049
§ 371 (c)(1),
(2) Date: Jul. 1, 2022

(87) PCT Pub. No.: WO2023/023892
PCT Pub. Date: Mar. 2, 2023

(65) Prior Publication Data
US 2024/0206249 A1    Jun. 20, 2024

(51) Int. Cl.
*H10K 59/131*  (2023.01)
*H01L 21/77*  (2017.01)
*H10K 59/124*  (2023.01)

(52) U.S. Cl.
CPC ................ *H10K 59/131* (2023.02)

(58) Field of Classification Search
CPC ............. H10K 59/131; H10K 59/1315; H10K 59/121; H10K 59/123; H10K 59/124; H01L 2224/02379; H01L 21/77
USPC ........................................................ 257/91
See application file for complete search history.

(56) References Cited

U.S. PATENT DOCUMENTS

| | | | |
|---|---|---|---|
| 2015/0016081 A1 | 1/2015 | Auchere et al. | |
| 2015/0380467 A1 | 12/2015 | Su | |
| 2018/0226460 A1* | 8/2018 | Zhu | H10K 50/81 |
| 2019/0064987 A1 | 2/2019 | Lu et al. | |
| 2021/0143183 A1 | 5/2021 | Zhang et al. | |

FOREIGN PATENT DOCUMENTS

| | | |
|---|---|---|
| CN | 104252276 A | 12/2014 |
| CN | 107203296 A | 9/2017 |
| CN | 107479757 A | 12/2017 |
| CN | 107819016 A | 3/2018 |

(Continued)

*Primary Examiner* — Andres Munoz
*Assistant Examiner* — Lawrence Scipioni
(74) *Attorney, Agent, or Firm* — Lippes Mathias LLP

(57) ABSTRACT

Provided is a display panel. The display panel includes: a base substrate, including a display region and a peripheral region adjacent to the display region; a first power trace, disposed in the peripheral region and on a side of the base substrate; a connecting trace, disposed in the peripheral region and on a side of the base substrate; a plurality of signal lines, disposed in the display region and the peripheral region; an insulating layer, disposed in the display region and the peripheral region; and a cathode layer, disposed in the display region and the peripheral region.

20 Claims, 10 Drawing Sheets

(56) References Cited

FOREIGN PATENT DOCUMENTS

| | | |
|---|---|---|
| CN | 108511394 A | 9/2018 |
| CN | 110112205 A | 8/2019 |
| CN | 110323257 A | 10/2019 |
| CN | 211150599 U | 7/2020 |

* cited by examiner

DISPLAY PANEL AND DISPLAY DEVICE

CROSS-REFERENCE TO RELATED APPLICATION

This application is a 371 of PCT application No. PCT/CN2021/14049, filed on Aug. 23, 2021, the content of which is incorporated herein by reference in its entirety.

TECHNICAL FIELD

The present disclosure relates to the field of display technologies, and in particular relates to a display panel and a display device.

BACKGROUND

A display panel generally includes a plurality of pixel units arranged in an array in a display region of a base substrate, and a power trace for providing negative power signals to a cathode layer in the display panel. Here, the negative power signal is usually referred to as a VSS signal, and the power trace providing the negative power signal is usually referred to as a VSS trace.

SUMMARY

The present disclosure provides a display panel and a display device. The technical solutions are as follows.

In an aspect, a display panel is provided. The display panel includes:

a base substrate, including a display region and a peripheral region adjacent to the display region;

a first power trace, disposed in the peripheral region and on a side of the base substrate, wherein the first power trace is extended along a first direction and configured to receive a first power signal:

a connecting trace, disposed in the peripheral region and on a side of the base substrate, wherein the connecting trace is electrically connected to the first power trace and extended along a second direction, the second direction intersecting the first direction;

a plurality of signal lines, disposed in the display region and the peripheral region, wherein orthographic projections of parts, disposed in the peripheral region, of the plurality of signal lines on the base substrate enclose a plurality of target regions arranged along the second direction, and an orthographic projection of the connecting trace on the base substrate is at least partially overlapped with the plurality of target regions;

an insulating layer, disposed in the display region and the peripheral region, wherein the insulating layer is disposed on a side, distal from the base substrate, of the connecting trace, and the insulating layer is provided with a plurality of first via holes arranged along the second direction: the plurality of first via holes being in one-to-one correspondence with the plurality of target regions, and an orthographic projection of the first via hole on the base substrate being within one corresponding target region; and a cathode layer, disposed in the display region and the peripheral region, wherein the cathode layer is disposed on a side, distal from the base substrate, of the insulating layer, and the cathode layer is electrically connected to the connecting trace through the plurality of first via holes.

Optionally, a number of the target regions is less than a number of the signal lines.

Optionally, a distance between a first part of the cathode layer and the base substrate is shorter than a distance between a second part of the cathode layer and the base substrate, wherein an orthographic projection of the first part of the cathode layer on the base substrate is overlapped with a region where the orthographic projections of the first via holes on the base substrate are; and an orthographic projection of the second part of the cathode layer on the base substrate is overlapped with a region where the orthographic projections of the signal lines on the base substrate are.

Optionally, the plurality of target regions includes: a first target region, a second target region adjacent to the first target region along the second direction, a third target region, and a fourth target region adjacent to the third target region along the second direction, wherein a number of the signal lines between the first target region and the second target region is the same as a number of the signal lines between the third target region and the fourth target region.

Optionally, each of the signal lines at least includes: a first line segment, a second line segment and a third line segment which are sequentially connected; wherein both the first line segment and the third line segment are extended along the second direction, and the second line segment is extended along a third direction, the third direction intersecting the second direction; and an orthographic projection of the first line segment on the base substrate is on a side, close to the display region, of the orthographic projections of the plurality of first via holes on the base substrate, an orthographic projection of the third line segment on the base substrate is on a side, distal from the display region, of the orthographic projections of the plurality of first via holes on the base substrate, and an orthographic projection of the second line segment on the base substrate is between the orthographic projections of two adjacent first via holes on the base substrate.

Optionally, the connecting trace includes a first sub-trace and a second sub-trace which are sequentially laminated along a direction distal from the base substrate, the first sub-trace and the second sub-trace being extended along the second direction: the insulating layer includes a first insulating layer group and a second insulating layer group; and each first via hole includes a first via hole group and a second via hole group, the first via hole group being in the first insulating layer group, and the second via hole group being in the second insulating layer group;

wherein the first insulating layer group is disposed between the first sub-trace and the second sub-trace, and the second insulating layer group is disposed on a side, distal from the base substrate, of the second sub-trace; and the first sub-trace is electrically connected to the second sub-trace through the first via hole group, and the second sub-trace is electrically connected to the cathode layer through the second via hole group.

Optionally, the display panel further includes: a transfer structure disposed between the first sub-trace and the second sub-trace; the first insulating layer group includes: a first sub-insulating layer, a second sub-insulating layer and a third sub-insulating layer which are sequentially laminated along the direction distal from the base substrate; the first via hole group includes: a plurality of first sub via holes, a, plurality of second sub via, holes and one third sub via hole, wherein the plurality of first sub via holes are in the first sub-insulating layer, the plurality of second sub via holes are in the second sub-insulating layer, and the third sub via hole is in the third sub-insulating layer; and the first sub-insulating layer is disposed between the first sub-trace and the transfer structure, and the second sub-insulating layer and the third sub-insulating layer are disposed between the transfer structure and the second sub-trace; and the first sub-trace is electrically connected to the transfer structure through the plurality of first sub via holes, and the transfer structure is electrically connected to the second sub-trace through the plurality of second sub via holes and the third sub via hole.

Optionally, the first sub-insulating layer and the second sub-insulating layer are made of an inorganic material, and the third sub-insulating layer is made of an organic material; and a size of the third sub via hole is greater than a size of the first sub via hole and greater than a size of the second sub via hole, and an orthographic projection of the third sub via hole in each first via hole group on the base substrate covers orthographic projections of the plurality, of first sub via, holes on the base substrate and covers orthographic projections of the plurality of second sub via holes on the base substrate.

Optionally, the second insulating layer group includes a fourth sub-insulating layer, the second via hole group includes one fourth sub via hole, wherein the fourth sub via hole is in the fourth sub-insulating layer: and the fourth sub-insulating layer is made of an organic material; and a size of the fourth sub via hole is greater than the size of the first sub via hole and greater than the size of the second sub via hole, and an orthographic projection of the fourth sub via hole in each first via hole on the base substrate is at least partially overlapped with the orthographic projection of the third sub via hole on the base substrate.

Optionally, the peripheral region includes a first region, wherein the first region is on a side of the display region and the first region includes a first fan-out region and a second fan-out region arranged along a third direction, wherein the first fan-out region is closer to the display region than the second fan-out region is, the third direction intersecting the second direction, wherein the orthographic projections of the plurality of first via holes on the base substrate are within the first fan-out region and are closer to the second fan-out region than the display region is.

Optionally, the first fan-out region includes a first fan-out sub-region and a second fan-out sub-region arranged along the second direction, and the plurality of first via holes includes a plurality of first-type via holes and a plurality of second-type via holes, wherein orthographic projections of the plurality of first-type via holes on the base substrate are within the first fan-out sub-region, and orthographic projections of the plurality of second-type via holes on the base substrate are within the second fan-out sub-region; and the plurality of first-type via holes and the plurality of second-type via holes are disposed symmetrically about a symmetry axis, extending along the third direction, of the base substrate.

Optionally, the second fan-out region includes a third fan-out sub-region and a fourth fan-out sub-region which are arranged along the second direction; and the insulating layer is further provided with a second via hole, and the cathode layer is electrically connected to the connecting trace through the second via hole, wherein an orthographic projection of the second via hole on the base substrate is between the first fan-out sub-region and the second fan-out sub-region and between the third fan-out sub-region and the fourth fan-out sub-region, and a size of the second via hole is greater than a size of the first via hole.

Optionally, parts, disposed in the first fan-out region, of the plurality of signal lines are disposed in a same layer as the transfer structure in the display panel, and parts, disposed in the second fan-out region, of the plurality of signal lines are disposed in a same layer as the first sub-trace in the connecting trace.

Optionally, the first sub-insulating layer in the insulating layer is further provided with a plurality of fifth sub via holes; and the part, disposed in the first fan-out region, of each of the plurality of signal lines is electrically connected to the part, disposed in the second fan-out region, of the signal line through at least one fifth sub via hole.

Optionally, the display panel further includes: a plurality of second power traces extending along a third direction, wherein the plurality of second power traces are disposed on a side of the base substrate, and the third direction intersects the second direction; and one end of each of the plurality of second power traces is electrically connected to transistors in a plurality of pixel units in the display panel, and the other end of the second power trace is configured to receive a second power signal.

Optionally, an orthographic projection of each of the plurality of second power traces on the base substrate is between two adjacent target regions.

Optionally, the second power trace includes a third sub-trace and a fourth sub-trace which are sequentially laminated along a direction distal from the base substrate and extended along the third direction: the third sub-trace being disposed in the same layer as a first sub-trace in the connecting trace, and the fourth sub-trace being disposed in the same layer as a transfer structure in the display panel; and the first sub-insulating layer in the insulating layer is further provided with a plurality of sixth sub via holes, and the third sub-trace is electrically connected to the fourth sub-trace through the plurality of sixth sub via holes.

Optionally, the peripheral region includes a first region and a second region, the first region and the second region being disposed on two sides of the display region respectively; wherein the first region includes a first fan-out region and a second fan-out region which are arranged along a third direction, wherein the first fan-out region is closer to the display region than the second fan-out region is; and the second region includes a third fan-out region and a fourth fan-out region which are arranged along the third direction, wherein the third fan-out region is closer to the display region than the fourth fan-out region is, the third direction intersecting the second direction, wherein the orthographic projections of part of the first via holes on the base substrate are within the first fan-out region and are closer to the second fan-out region than the display region is; and the orthographic projections of the other part of the first via holes on the base substrate are within the third fan-out region and are closer to the fourth fan-out region than the display region is.

Optionally, the plurality of signal lines includes a plurality of first-type signal lines and a plurality of second-type signal lines; the display panel further including: a plurality of pixel units, the plurality of pixel units including a plurality of first pixel unit groups and a plurality of second pixel unit groups, wherein each of the first pixel unit groups includes a plurality of first-type pixel units arranged along the third direction, and each of the second pixel unit groups includes a plurality of second-type pixel units arranged along the third direction;

wherein one end of each of the first-type signal lines is disposed in the first region and is configured to receive a driving signal, and the other end of the first-type signal line is disposed in the display region and is configured to provide the driving signal for the plurality of first-type pixel units in one first pixel unit group; and wherein one end of each of the second-type signal lines is disposed in the second region and is configured to receive the driving signal, and the other end of the second-type signal line is disposed in the display region and is configured to provide the driving signal for the plurality of second-type pixel units in one second pixel unit group.

Optionally, the plurality of first pixel unit groups and the plurality of second pixel unit groups are arranged at intervals.

Optionally, the first power trace and the connecting trace are disposed in a same layer.

Optionally, the display panel further includes: a, plurality of auxiliary electrode structures disposed in the display region and extended along a third direction, the third direction intersecting the second direction;

wherein the plurality of auxiliary electrode structures are electrically connected to the cathode layer.

In another aspect, a display device is provided. The display device includes: a power supply assembly and the display panel described in the above aspect.

The power supply assembly is configured to supply power to the display panel.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, the embodiments of the present disclosure are described in detail hereinafter with reference to the accompanying drawings.

In the related art, the display panel further includes an insulating layer between the VSS trace and the cathode layer. One end of the VSS trace is connected to the cathode layer through a via hole in the insulating layer, and the other end of the VSS trace is connected to a driving chip. Thus, the driving chip can transmit the VSS signal to the cathode layer via the VSS trace.

However, in the solution provided in the related art, VSS signals provided by the driving chip to the regions of the cathode layer may be uneven, and the display effect of the display panel is poor.

Terms used in the embodiments of the present disclosure are merely used to explain the embodiments of the present disclosure, and are not intended to limit the present disclosure. Unless otherwise defined, the technical terms or scientific terms used in the embodiments of the present disclosure shall have the general meanings as understood by those of ordinary skill in the art to which the present disclosure belongs. The terms "first", "second", "third" and the like used in the description and claims of the present disclosure do not denote any order, quantity or importance, but are merely used to distinguish different components. Similarly, the terms such as "one" or "a/an" do not limit the quantity, but indicate the existence of at least one. The terms "comprise/include", "contain" and the like are intended to mean that the element or object preceding the term covers the elements or objects or equivalents listed after the term, without excluding other elements or objects. The terms "connected to", "connected with" and the like are not limited to physical or mechanical connections, and may include electrical connection, and the connection may be direct or indirect. The terms "on", "under", "left", "right" and the like are only used to indicate the relative positional relationship, and the relative positional relationship may also change accordingly after the absolute position of the described object changes.

Figure 1:
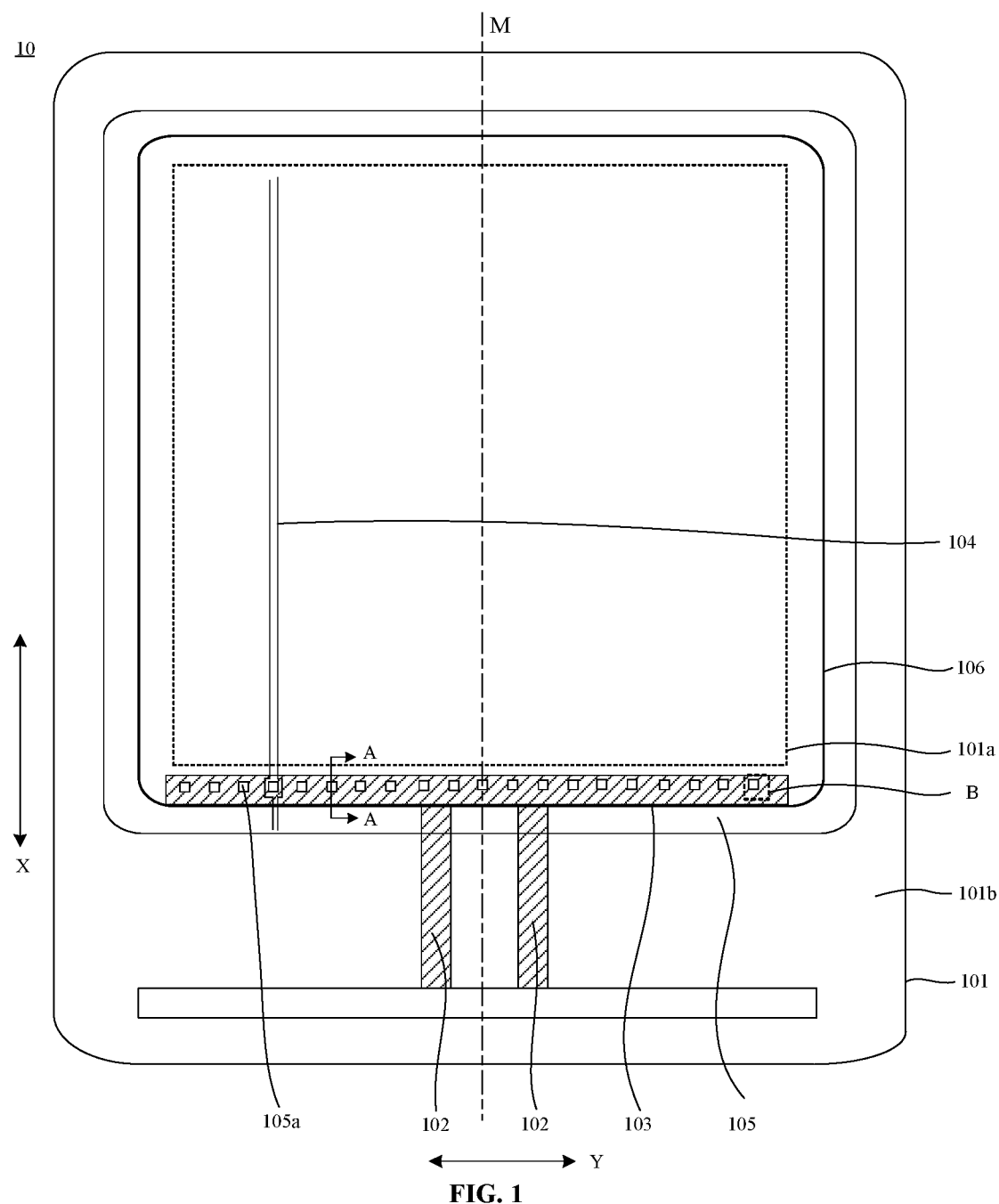
FIG. 1 is a schematic structural diagram of a display panel according to an embodiment of the present disclosure.
Figure 2:
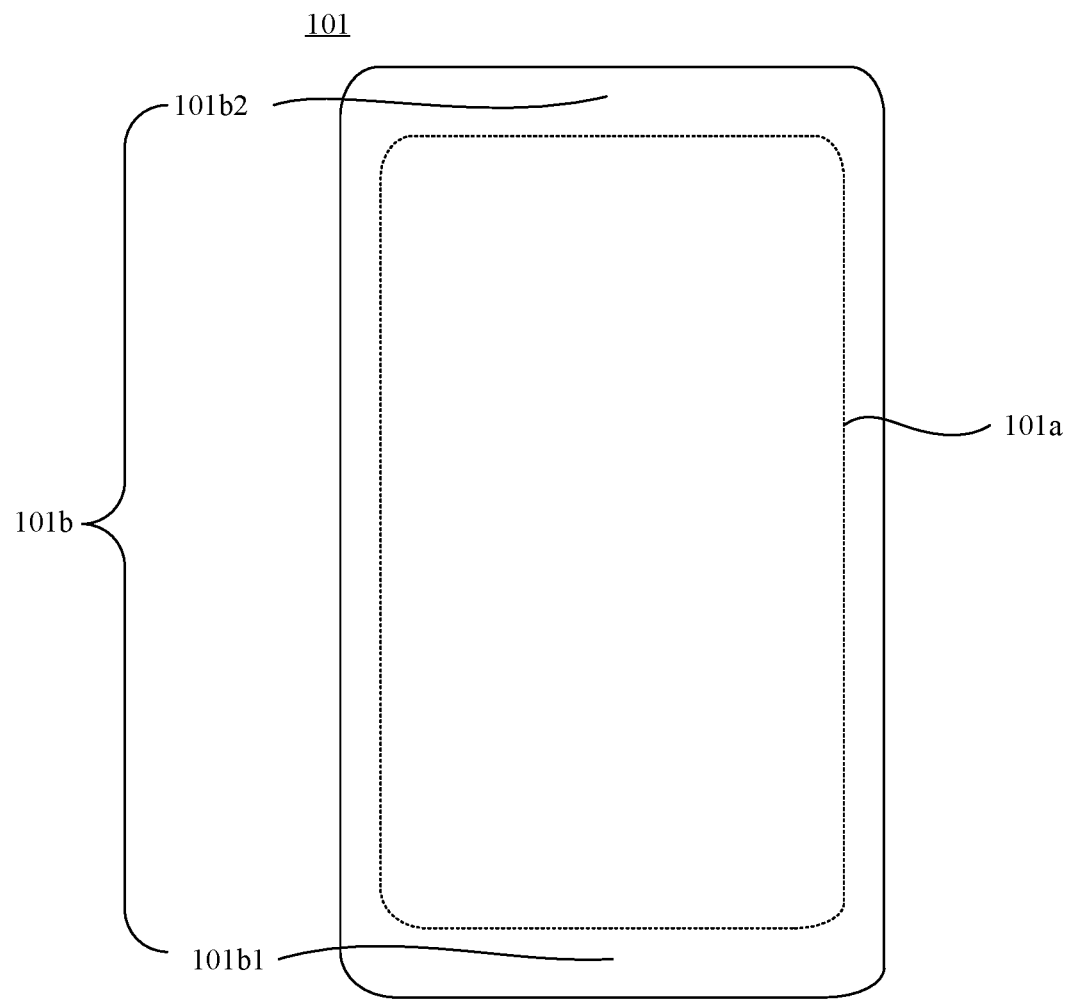
FIG. 2 is a top view of a base substrate according to an embodiment of the present disclosure.

FIG. 1 is a schematic structural diagram of a display panel according to an embodiment of the present disclosure. Referring to FIG. 1, the display panel 10 may include: a base substrate 101, a first power trace 102, a connecting trace 103, a plurality of signal lines 104, an insulating layer 105 and a cathode layer 106. Here, FIG. 1 only schematically shows two first power traces 102 and two signal lines 104. In practice, the display panel 10 may include more first power traces 102 and more signal lines 104. FIG. 2 is a top view of a base substrate according to an embodiment of the present disclosure. Referring to FIG. 2, the base substrate 101 may include a display region 101a, and a peripheral region 101b adjacent to the display region 101a.

Figure 3:
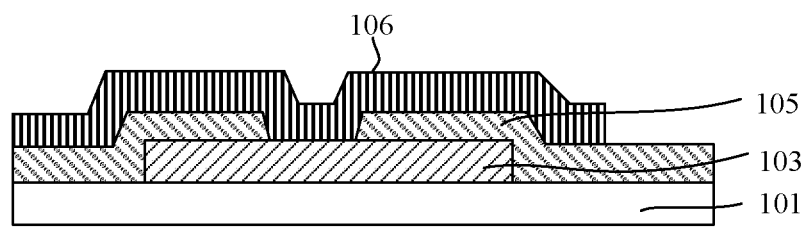
FIG. 3 is a sectional view of the display panel shown in FIG. 1 along an AA direction.

FIG. 3 is a sectional view of the display panel shown in FIG. 1 along the AA direction. Referring to FIG. 1 to FIG. 3, the first power traces 102 may be disposed in the peripheral region 101b and on a side of the base substrate 101. The connecting trace 103 is disposed in the peripheral region 101b and on a side of the base substrate 101. The plurality of signal lines 104 are disposed in the display region 101a and the peripheral region 101b, and orthographic projections of the parts, disposed in the peripheral region 101b, of the signal lines 104 on the base substrate 101 enclose a plurality of target regions arranged along a second direction Y, and an orthographic projection of the connecting trace 103 on the base substrate 101 is at least partially overlapped with the target regions. The insulating layer 105 is disposed in the display region 101a and the peripheral region 101b, and the insulating layer 105 is disposed on the side of the connecting trace 103 distal from the base substrate 101. The cathode layer 106 is disposed in the display region 101a and the peripheral region 101b, and the cathode layer 106 is disposed on the side of the insulating layer 105 distal from the base substrate 101.

Here, the orthographic projections of the parts, disposed in the peripheral region 101b, of the signal lines 104 on the base substrate 101 enclose a plurality of target regions arranged along the second direction Y. That is, the orthographic projections of the parts, disposed in the peripheral region 101b, of the signal lines 104 on the base substrate 101 are not overlapped with the plurality of target regions.

Referring to FIG. 1, the first power trace 102 is configured to receive a first power signal, and the first power trace 102 is further electrically connected to the connecting trace 103. In this way, the first power signal received by the first power trace 102 can be transmitted to the connecting trace 103. Here, the first power trace 102 is extended along a first direction X, and the connecting trace 103 is extended along the second direction Y. The second direction Y intersects the first direction X. For example, in FIG. 1, the second direction Y is perpendicular to the first direction X. The first direction X may be a pixel column direction, and the second direction Y may be a pixel row direction.

Since the plurality of target regions are not overlapped with the orthographic projections of the parts, disposed in the peripheral region 101b, of the signal lines 104 on the base substrate 101, by forming holes at the target regions in the insulating layer 105, not only the connecting trace 103 can be electrically connected to the cathode layer 106, but also the signal lines 104 can be prevented from being affected by the holes. For example, with reference to FIG. 1 and FIG. 3, the insulating layer 105 may be provided with a plurality of first via holes 105a arranged along the second direction Y. The plurality of first via holes 105a are in one-to-one correspondence with the plurality of target regions, and the orthographic projection of the first via hole 105a on the base substrate 101 is within the corresponding target region. The cathode layer 106 and the connecting trace 103 may be electrically connected through the plurality of first via holes 105a. That is, the first power signals received by the connecting trace 103 from the first power traces 102 may be transmitted to the cathode layer 106 through the plurality of first via holes 105a.

In the embodiment of the present disclosure, the orthographic projections of the parts, disposed in the peripheral region 101b, of the signal lines 104 on the base substrate 101 enclose the plurality of target regions arranged along the second direction Y. Therefore, the plurality of first via holes 105a arranged along the second direction Y may be provided in the insulating layer 105, such that the connecting trace 103 can be connected to different regions of the cathode layer 106 along the second direction Y, which improves the uniformity of the first power signals received in the regions of the cathode layer 106 in the second direction Y. Thus, the display panel 10 has a good display effect. In addition, since the insulating layer 105 is provided with the plurality of first via holes 105a arranged along the second direction Y, the contact area between the connecting trace 103 and the cathode layer 106 may be larger, which can reduce the risk of screen burning of the display panel 10. Here, the uniformity of the first power signals refers to the consistency of voltages (or levels) of the first power signals.

In summary, the embodiment of the present disclosure provides a display panel. The orthographic projections of parts, disposed in the peripheral region, of the plurality of signal lines in the display panel on the base substrate enclose the plurality of target regions arranged along the second direction. Thus, the plurality of first via holes arranged along the second direction may be formed in the insulating layer, such that the connecting trace can transmit the first power signals received from the first power traces to the cathode layer through the first via holes. Therefore, the uniformity of the first power signals received in the regions of the cathode layer in the second direction is improved, and the display effect of the display panel is better.

In the embodiments of the present disclosure, the first power signal provided by the first power trace 102 to the cathode layer 108 may be a negative power signal, and the first power trace 102 may also be referred to as a VSS power line or a VSS trace.

Optionally, at least one signal line 104 may be disposed between every two adjacent target regions. In addition, the number of the target regions may be smaller than the number of the signal lines 104.

In the embodiments of the present disclosure, the target region may include a first target region, a second target region adjacent to the first target region along the second direction Y, a third target region, and a fourth target region adjacent to the third target region along the second direction. The number of the signal lines between the first target region and the second target region may be the same as the number of the signal lines between the third target region and the fourth target region.

Here, the first target region and the third target region may be any target regions of the plurality of target regions, and the first target region and the third target region are different target regions. For example, the third target region and the second target region may be the same target region. As such, the first target region, the second target region (the third target region) and the fourth target region may be three continuous adjacent target regions. Or, the third target region is any target region other than the first target region and the second target region.

Figure 4:
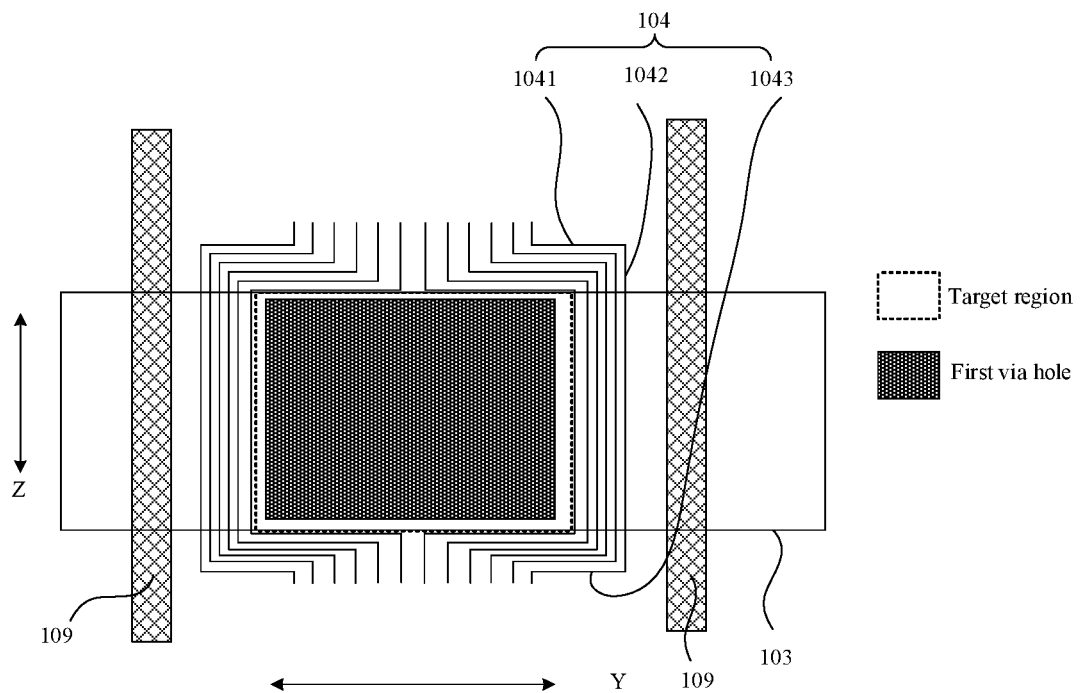
FIG. 4 is a partial schematic diagram of a region B of the display panel shown in FIG. 1.

FIG. 4 is a partial schematic diagram of a region B of the display panel shown in FIG. 1. Referring to FIG. 4, the orthographic projections of the plurality of signal lines 104 on the base substrate 101 are not overlapped with the orthographic projections of the plurality of first via holes 105a on the base substrate 101. Since the plurality of signal lines 104 are not overlapped with the first via holes 105a, the plurality of first via holes 105a can be prevented from affecting the signal transmission of the plurality of signal lines 104, thereby ensuring the accuracy of the signal transmission of the signal lines 104.

Referring to FIG. 4, each signal line 104 may at least include: a first line segment 1041, a second line segment 1042 and a third line segment 1043 which are sequentially connected. Both the first line segment 1041 and the third line segment 1043 may be extended in the second direction Y, and the second line segment 1042 may be extended in the third direction Z. An orthographic projection of the first line segment 1041 on the base substrate 101 may be on the side, close to the display region 101a, of the orthographic projections of the first via holes 105a on the base substrate 101. An orthographic projection of the third line segment 1043 on the base substrate 101 is on the side, distal from the display region 101a, of the orthographic projections of the first via holes 105a on the base substrate 101. An orthographic projection of the second line segment 1042 on the base substrate 101 is between the orthographic projections of two adjacent first via holes 105a on the base substrate 101.

Here, the third direction Z intersects the second direction Y. Optionally, the third direction Z may be perpendicular to the second direction Y. For example, the second direction Y is the pixel row direction of the display panel 10, and the third direction Z is the pixel column direction of the display panel 10.

Since the second line segment 1042 of each signal line 104 is extended along the third direction Z, and the connecting trace 103 is extended along the second direction Y, the orthographic projection of the second line segment 1042 of each signal line 104 on the base substrate 101 may be overlapped with the orthographic projection of the connecting trace 103 on the base substrate 101. In addition, the areas of the overlapping regions between the orthographic projections of the second line segments 1042 of all the signal lines 104 on the base substrate 101 and the orthographic projection of the connecting trace 103 on the base substrate 101 may be the same. Therefore, it can be ensured that parasitic capacitances generated between the signal lines 104 and the connecting trace 103 are the same, which improves the uniformity of the signals transmitted by the signal lines 104.

In addition, since both the first line segment 1041 and the third line segment 1043 of each signal line 104 are extended along the second direction Y and the connecting trace 103 is extended along the second direction Y, in order to avoid a larger parasitic capacitance from being generating between each signal line 104 and the connecting trace 103, the orthographic projection of the first line segment 1041 of each signal line 104 on the base substrate 101 and the orthographic projection of the third line segment 1043 of each signal line 104 on the base substrate 101 are not overlapped with the orthographic projection of the connecting trace 103 on the base substrate 101.

Figure 5:
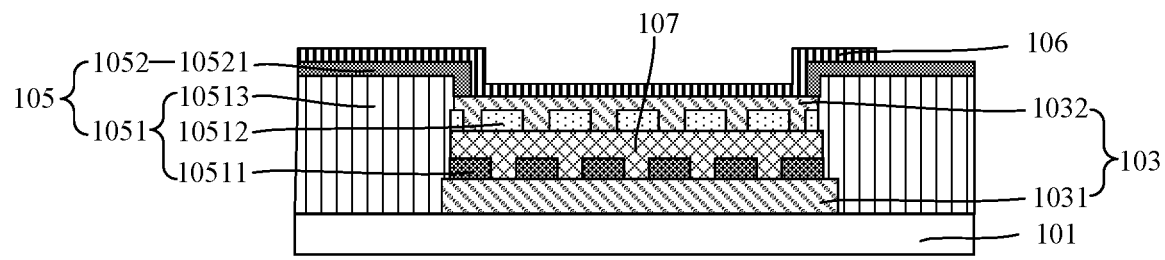
FIG. 5 is another sectional view of the display panel shown in FIG. 1 along the AA direction.

FIG. 5 is another sectional view of the display panel shown in FIG. 1 along the AA direction. Referring to FIG. 5, the connecting trace 103 may include a first sub-trace 1031 and a second sub-trace 1032 which are sequentially laminated in a direction distal from the base substrate 101. Here, both the first sub-trace 1031 and the second sub-trace 1032 are extended along the second direction Y. The insulating layer 105 may include a first insulating layer group 1051 and a second insulating layer group 1052.

Figure 6:
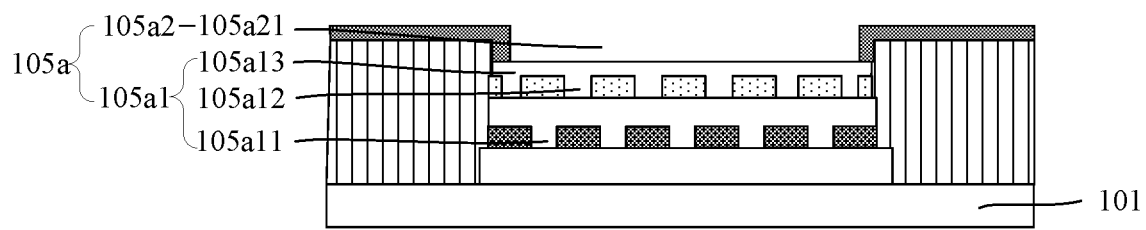
FIG. 6 is a schematic structural diagram of a first via hole according to an embodiment of the present disclosure.

Referring to FIG. 6, each first via hole 105a includes a first via hole group 105a1 and a second via hole group 105a2. The first via hole group 105a1 is disposed in the first insulating layer group 1051, and the second via hole group 105a2 is disposed in the second insulating layer group 1052.

In FIG. 6, in order to show each via hole group, other structures except the groups of the insulating layer 105 are represented by white fillings, and the cathode layer 106 is not shown in FIG. 6.

With reference to FIG. 5 and FIG. 6, the first insulating layer group 1051 is disposed between the first sub-trace 1031 and the second sub-trace 1032, and the second insulating layer group 1052 is disposed on the side of the second sub-trace 1032 distal from the base substrate 101. Here, the first sub-trace 1031 is electrically connected to the second sub-trace 1032 through the first via hole group 105a1, and the second sub-trace 1032 is electrically connected to the cathode layer 106 through the second via hole group 105a2. That is, the connecting trace 103 can transmit the first power signals to the cathode layer 106 through two sub-trace layers.

In the embodiment of the present disclosure, with reference to FIG. 5 and FIG. 6, the display panel 10 may further include a transfer structure 107 disposed between the first sub-trace 1031 and the second sub-trace 1032. The first insulating layer group 1051 includes a first sub-insulating layer 10511, a second sub-insulating layer 10512 and a third sub-insulating layer 10513 sequentially laminated in a direction distal from the base substrate 101. The first via hole group 105a1 may include a plurality of first sub via holes 105a11, a plurality of second sub via holes 105a12 and one third sub via hole 105a13. The plurality of first sub via holes 105a11 are disposed in the first sub-insulating layer 10511, the plurality of second sub via holes 105a12 are disposed in the second sub-insulating layer 10512, and the third sub via hole 105a13 is disposed in the third sub-insulating layer 10513.

Here, the first sub-insulating layer 10511 is disposed between the first sub-trace 1031 and the transfer structure 107, and the second sub-insulating layer 10512 and the third sub-insulating layer 10513 are disposed between the transfer structure 107 and the second sub-trace 1032. The first sub-trace 1031 is electrically connected to the transfer structure 107 through the plurality of first sub via holes 105a11, and the transfer structure 107 is electrically connected to the second sub-trace 1032 through the plurality of second sub via holes 105a12 and the third sub via hole 105a13.

By providing the transfer structure 107 between the first sub-trace 1031 and the second sub-trace 1032, the first insulating layer group 1051 (the first sub-insulating layer 10511, the second sub-insulating layer 10512 and the third sub-insulating layer 10513) between the first sub-trace 1031 and the second sub-trace 1032 is prevented from breaking due to its larger thickness, thereby ensuring the yield of the display panel 10.

Figure 7:
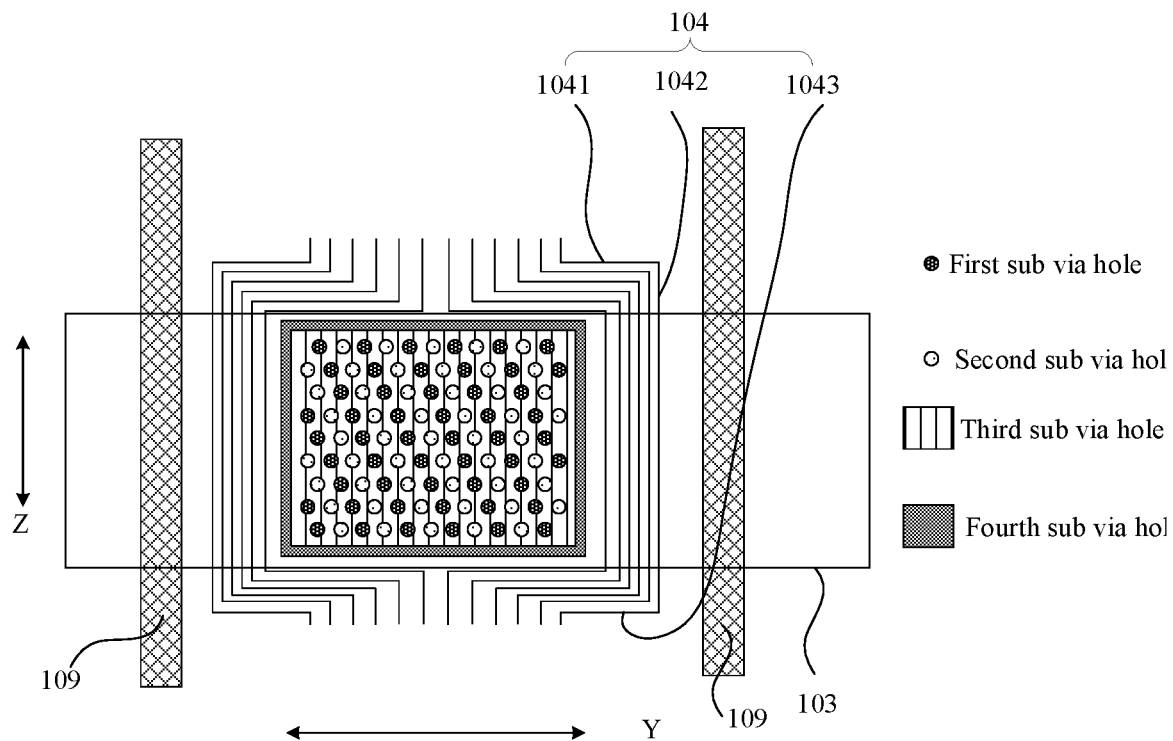
FIG. 7 is another partial schematic diagram of the region B of the display panel shown in FIG. 1.

Optionally, the first sub-insulating layer 10511 and the second sub-insulating layer 10512 are made of an inorganic material, and the third sub-insulating layer 10513 is made of an organic material. FIG. 7 is another partial schematic diagram of the region B of the display panel shown in FIG. 1. Referring to FIG. 7, the size of the third sub via hole 105a13 may be greater than the size of the first sub via hole 105a11 and greater than the size of the second sub via hole 105a12. In FIG. 7, both the first sub via hole 105a11 and the second sub via hole 105a12 are circular, and the third sub via hole 105a13 is rectangular. Certainly, the first sub via hole 105a11, the second sub via hole 105a12 and the third sub via hole 105a13 may also be in other shapes, which are not limited in the embodiments of the present disclosure.

Since the first sub-insulating layer 10511 and the second sub-insulating layer 10512 are made of an inorganic material, in order to prevent the sub via holes in these two sub-insulating layers from affecting the quality of the sub-insulating layers, the size of the first sub via holes 105*a*11 in the first sub-insulating layer 10511 and the size of the second sub via holes 105*a*12 in the second sub-insulating layer 10512 may be designed to be smaller. In addition, in order to ensure the reliable connection between the first sub via holes 105*a*11 and the second sub via holes 105*a*12, relatively more first sub via holes 105*a*11 may be formed in the first sub-insulating layer 10511 and relatively more second sub via holes 105*a*12 may be formed in the second sub-insulating layer 10512.

Since the third sub-insulating layer 10513 is made of an organic material, the third sub via hole 105*a*13 with a larger size in the third sub-insulating layer 10513 does not affect the quality of the third sub-insulating layer 10513. Therefore, one third sub via hole 105*a*13 with a larger size may be formed in the third sub-insulating layer 10513.

Optionally, the orthographic projection of the third sub via hole 105*a*13 in each first via hole group 105*a*1 on the base substrate 101 covers the orthographic projections of the plurality of first sub via holes 105*a*11 on the base substrate 101, and covers the orthographic projections of the plurality of second sub via holes 105*a*12 on the base substrate 101. Certainly, the orthographic projection of the third sub via hole 105*a*13 in each first via hole group 105*a*1 on the base substrate 101 may cover the orthographic projections of some of the first sub via holes 105*a*11 on the base substrate 101 and the orthographic projections of some of the second sub via holes 105*a*12 on the base substrate 101, which is not limited in the embodiments of the present disclosure.

With reference to FIG. 5 to FIG. 7, it can be seen that the second insulating layer group 1052 may include a fourth sub-insulating layer 10521, the second via hole group 105*a*2 includes a fourth sub via hole 105*a*21, and the fourth sub via hole 105*a*21 is disposed in the fourth sub-insulating layer 10521.

In the embodiments of the present disclosure, the fourth sub-insulating layer 10521 may be made of an organic material. Therefore, the size of the fourth sub via hole 105*a*21 may be greater than the size of the first sub via hole 105*a*11 and the size of the second sub via hole 105*a*12. In addition, the orthographic projection of the fourth sub via hole 105*a*21 in each first via hole 105*a* on the base substrate 101 may be at least partially overlapped with the orthographic projection of the third sub via hole 105*a*13 on the base substrate 101, so as to ensure the effective connection between the cathode layer 106 and the connecting trace 103.

Optionally, referring to FIG. 7, the orthographic projection of the fourth sub via hole 105*a*21 in each first via hole 105*a* on the base substrate 101 may cover the orthographic projection of the third sub via hole 105*a*13 on the base substrate 101.

In the embodiments of the present disclosure, the first sub-insulating layer 10511 may be an interlayer dielectric (ILD) layer, the second sub-insulating layer 10512 may be a passivation (PVX) layer, the third sub-insulating layer 10513 may be a planarization (PLN) layer, and the fourth sub-insulating layer 10521 may be a pixel definition layer (PDL).

It should be noted that the first insulating layer group 1051 may include more sub-insulating layers in addition to the first sub-insulating layer 10511, the second sub-insulating layer 10512 and the third sub-insulating layer 10513. In addition, the second insulating layer group 1052 may include more sub-insulating layers in addition to the fourth sub-insulating layer 10521. The number of the sub-insulating layers in the first insulating layer group 1051 and the number of the sub-insulating layers in the second insulating layer group 1052 are not limited in the embodiments of the present disclosure.

In the embodiment of the present disclosure, the first power trace 102 may be disposed in the same layer as the connecting trace 103. Here, the first power trace 102 and the connecting trace 103 being disposed in the same layer may refer to that the connecting trace 103 includes a first sub-trace 1031 and a second sub-trace 1032, the first power trace 102 may also include two sub-trace layers, and one layer of sub-trace in the first power trace 102 is disposed in the same layer as the first sub-trace 1031 in the connecting trace 103, and the other layer of sub-trace in the first power trace 102 is disposed in the same layer as the second sub-trace 1032 in the connecting trace 103. In addition, the first power trace 102 being the electrically connected to the connecting trace 103 may refer to that one layer of sub-trace in the first power trace 102 is electrically connected to the first sub-trace 1031 in the connecting trace 103, and the other layer of sub-trace in the first power trace 102 is electrically connected to the second sub-trace 1032 in the connecting trace 103.

In an example embodiment, one layer of sub-trace in the first power trace 102 and the first sub-trace 1031 in the connecting trace 103 are of an integral structure, and the other layer of sub-trace in the first power trace 102 and the second sub-trace 1032 in the connecting trace 103 are of an integral structure.

Optionally, one layer of sub-trace and the other layer of sub-trace in the first power trace 102 may be connected in the same way as the first sub-trace 1031 and the second sub-trace 1032 in the connecting trace 103, which is not limited in the embodiments of the present disclosure herein.

Figure 8:
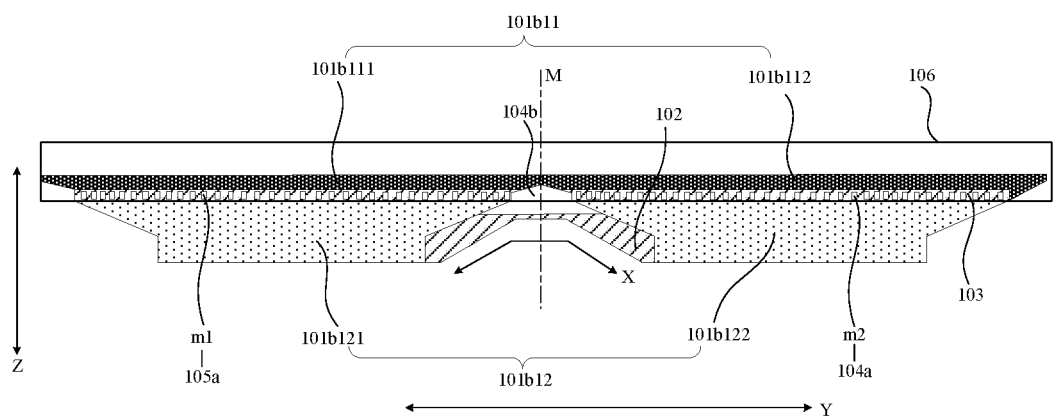
FIG. 8 is a schematic structural diagram of a first region of a display panel according to an embodiment of the present disclosure.

In the embodiments of the present disclosure, referring to FIG. 2, the peripheral region 101*b* may include a first region 101*b*1 on a side of the display region 101*a*. FIG. 8 is a schematic structural diagram of a first region of a display panel according to an embodiment of the present disclosure. Referring to FIG. 8, the first region 101*b*1 may include a first fan-out region 101*b*11 and a second fan-out region 101*b*12 arranged along the third direction Z. The first fan-out region 101*b*11 is closer to the display region 101*a* than the second fan-out region 101*b*12 is.

In FIG. 8, the extending direction (the first direction X) of the first power trace 102 is bent, and the first direction X intersects the second direction Y and the third direction Z.

Referring to FIG. 8, the orthographic projections of the plurality of first via holes 105*a* on the base substrate 101 are within the first fan-out region 101*b*11, and are closer to the second fan-out region 101*b*12 than the display region 101*a* is.

In the embodiments of the present disclosure, the orthographic projection of the cathode layer 106 on the base substrate 101 may be within the first fan-out region 101*b*11, but not within the second fan-out region 101*b*12. Therefore, by making the orthogonal projections of the plurality of first via holes 105*a* on the base substrate 101 be within the first fan-out region 101*b*11, it's ensured that the connecting trace 103 can be electrically connected to the cathode layer 106 through the plurality of first via holes 105*a*. In addition, the first via holes 105*a* are relatively distal from the display region 101*a*, such that the plurality of first via holes 105*a* can be prevented from affecting the normal display of the display region 101*a*, thereby ensuring the display effect of the display panel 10.

Referring to FIG. 8, it can also be seen that the first fan-out region 101*b*11 may include a first fan-out sub-region 101b111 and a second fan-out sub-region 101b112 arranged along the second direction Y. The plurality of first via holes 105a include a plurality of first-type via holes m1 and a plurality of second-type via holes m2. Orthographic projections of the plurality of first-type via holes m1 on the base substrate 101 are within the first fan-out sub-region 101bi 11, and orthographic projections of the plurality of second-type via holes m2 on the base substrate 101 are within the second fan-out sub-region 101b112. Here, the plurality of first-type via holes m1 and the plurality of second-type via holes m2 are disposed symmetrically about the symmetry axis M along the third direction Z of the base substrate 101. The symmetry axis M may pass the middle region of the base substrate 101.

Since the plurality of first via holes 105a are disposed symmetrically about the symmetry axis M along the third direction Z of the base substrate 101, the plurality of target regions are also disposed symmetrically about the symmetry axis M along the third direction Z of the base substrate 101.

In the embodiments of the present disclosure, referring to FIG. 8, the second fan-out region 101b12 may include a third fan-out sub-region 101b121 and a fourth fan-out sub-region 101b122 arranged along the second direction Y. In addition, a second via hole 104b may be further formed in the insulating layer 105, and the cathode layer 106 may be electrically connected to the connecting trace 103 through the second via hole 104b.

Here, an orthographic projection of the second via hole 104b on the base substrate 101 is between the first fan-out sub-region 101b111 and the second fan-out sub-region 101b112, and between the third fan-out sub-region 101b121 and the fourth fan-out sub-region 101b122. The size of the second via hole 104b is greater than that of the first via hole 105a. Thus, the cathode layer 106 can be electrically connected to the connecting trace 103 through not only the plurality of first via hole 105a but also the second via hole 104b, which can ensure the reliable connection between the connecting trace 103 and the cathode layer 106.

Optionally, the orthographic projection of the second via hole 104b on the base substrate 101 is partially overlapped with the orthographic projection of the connecting trace 103 on the base substrate 101, and is partially overlapped with the orthographic projection of the first power trace 102 on the base substrate 101. Thus, the connecting trace 103 may be electrically connected to the cathode layer 106 through the second via hole 104b, and the first power trace 102 may also be electrically connected to the cathode layer 106 through the second via hole 104b, so as to ensure the reliability of receiving the first power signals by the cathode layer 106.

In the embodiments of the present disclosure, corresponding to the first via hole 105a, the second via hole 104b may include a third via hole group and a fourth via hole group (not shown). The third via hole group is disposed in the first insulating layer group 1051, and the fourth via hole group is disposed in the second insulating layer group 1052. The two sub-trace layers (the first sub-trace 1031 and the second sub-trace 1032) in the connecting trace 103 may be electrically connected through the third via hole group and the two layers of sub-traces in the first power trace 102 may be electrically connected through the third via hole group; and both the second sub-trace 1032 in the connecting trace 103 and the other layer of sub-trace (the other layer of sub-trace in the same layer as the second sub-trace 1032) in the first power trace 102 may be electrically connected to the cathode layer through the fourth via hole group.

Figure 9:
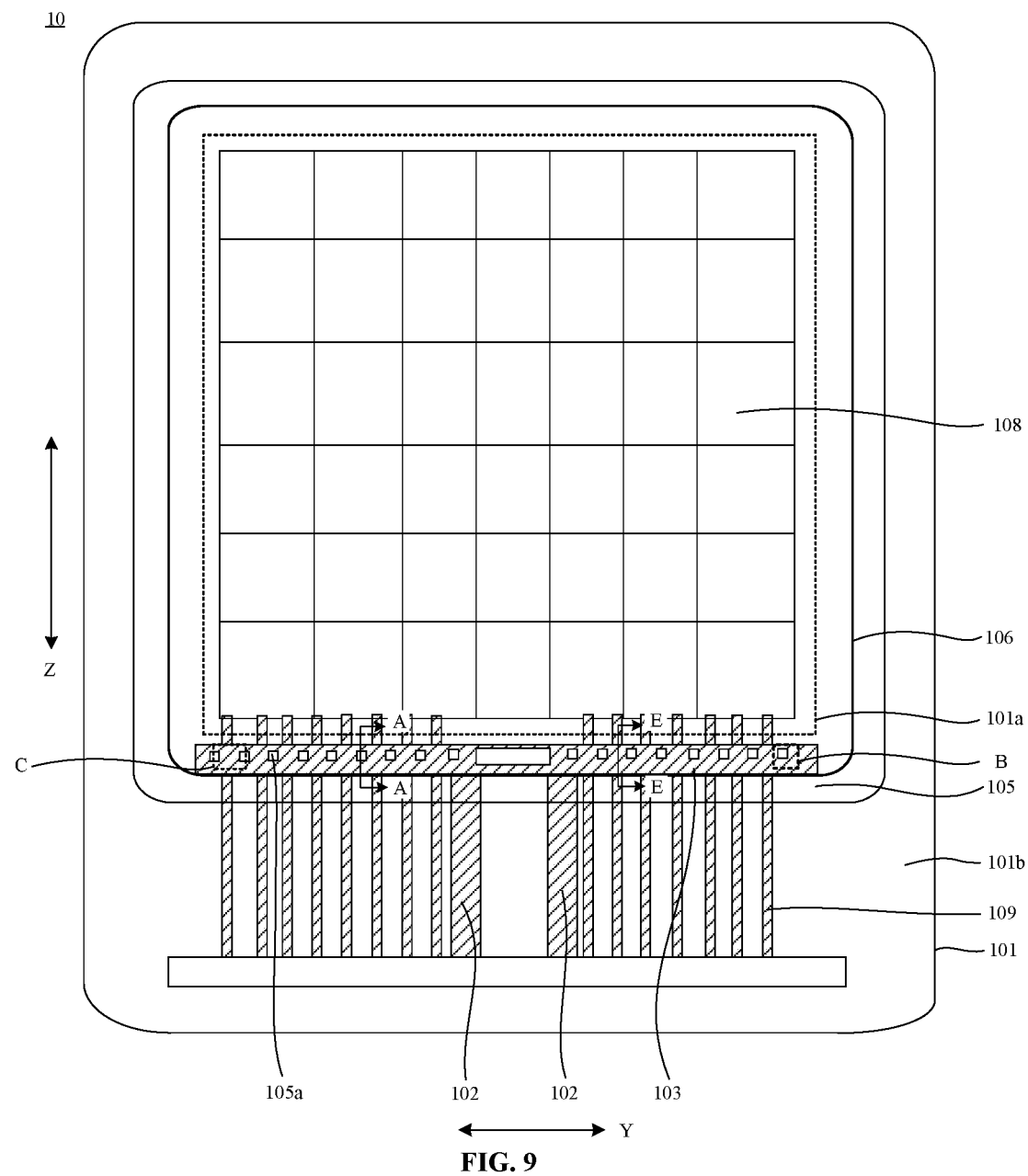
FIG. 9 is a schematic structural diagram of another display panel according to an embodiment of the present disclosure.

FIG. 9 is a schematic structural diagram of another display panel according to an embodiment of the present disclosure. Referring to FIG. 9, the display panel 10 may further include a plurality of pixel units 108. The plurality of pixel units 108 are disposed in the display region 101a. One ends of the signal lines 104 are disposed in the peripheral region 101b, and are configured to receive driving signals; and the other ends of the signal lines 104 are disposed in the display region 101a, and are configured to provide the driving signals for the plurality of pixel units 108. Optionally, the plurality of signal lines 104 may be data signal lines 104. Each signal line 104 may be connected to one column of pixel units 108, and is configured to provide the driving signal for the column of pixel units 108.

Optionally, the pixel unit 108 may include a pixel circuit and a light-emitting unit. The pixel unit 108 may include at least one transistor. The at least one transistor may include: a gate layer, an active layer, and a source and drain layer (the source and drain layer includes a source and a drain which are spaced apart, and both the source and the drain are electrically connected to the active layer). The light-emitting unit may include an anode, a light-emitting layer and a cathode. Here, the cathodes of the light-emitting units of the plurality of pixel units 108 in the display region 101a may be of an integral structure and form the cathode layer 106 of the display panel 10.

Optionally, the first sub-trace 1031 of the connecting trace 103 may be disposed in the same layer as the gate layer of the transistor, and the second sub-trace 1032 of the connecting trace 103 may be disposed in the same layer as the anode of the light-emitting unit. The transfer structure 107 in the display panel 10 may be disposed in the same layer as the source and drain layer of the transistor. That is, the first sub-trace 1031 and the gate layer of the transistor may be made of the same material by the same patterning process. The second sub-trace 1032 and the anode of the light-emitting unit may be made of the same material by the same patterning process. The transfer structure 107 in the display panel and the source and drain layer of the transistor may be made of the same material by the same patterning process.

In the embodiments of the present disclosure, the orthographic projections of the plurality of signal lines 104 on the base substrate 101 may be in the first fan-out region 101b11 and the second fan-out region 101b12. That is, the plurality of signal lines 104 may include parts of signal lines disposed in the first fan-out region 101b11 and parts of the signal lines disposed in the second fan-out region 101b12.

Here, the parts of the signal lines 104 disposed in the first fan-out region 101b11 may be disposed in the same layer as the transfer structure 107, and the parts of the signal lines 104 disposed in the second fan-out region 101b12 may be disposed in the same layer as the first sub-trace 1031 in the connecting trace 103. That is, the parts of the signal lines 104 disposed in the first fan-out region 101b11 and the transfer structure 107 may be made of the same material by the same patterning process; and the parts of the signal lines 104 disposed in the second fan-out region 101b12 and the first sub-trace 1031 in the connecting trace 103 may be made of the same material by the same patterning process.

Since the first sub-insulating layer 10511 is disposed between the transfer structure 107 and the first sub-trace 1031 in the connecting trace 103, the first sub-insulating layer 10511 may also be between the parts of the signal lines 104 disposed in the first fan-out region 101b11 and the parts of the signal lines 104 disposed in the second fan-out region 101b12.

Figure 10:
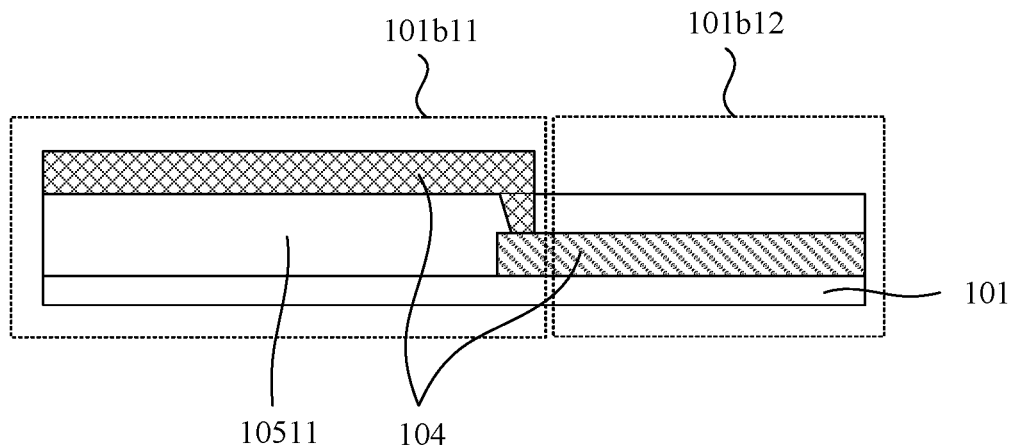
FIG. 10 is a schematic diagram of a signal line according to an embodiment of the present disclosure.

Thus, referring to FIG. 10, a plurality of fifth sub via holes (not shown in FIG. 10) may be further formed in the first sub-insulating layer 10511. The part of each signal line 104 disposed in the first fan-out region 101b11 may be electrically connected to the part of the signal line disposed in the second fan-out region 101b12 through at least one fifth sub via hole, such that each signal line 104 can transmit the driving signal.

In FIG. 10, the part of the signal line 104 disposed in the first fan-out region 101b11 may be electrically connected to the part of the signal line 104 disposed in the second fan-out region 101b12 through one fifth sub via hole. Certainly, the part of each signal line 104 disposed in the first fan-out region 101b11 may be electrically connected to the part of the signal line 104 disposed in the second fan-out region 101b12 through more (for example, four) fifth sub via holes, which is not limited in the embodiments of the present disclosure.

Referring to FIG. 4, FIG. 7 and FIG. 9, the display panel 10 may further include a plurality of second power traces 109 extending in the third direction Z. The plurality of second power traces 109 are disposed on a side of the base substrate 101. One end of each second power trace 109 is electrically connected to the transistors in the plurality of pixel units 108, and the other end of the second power trace 109 is configured to receive a second power signal.

In an example embodiment, one end of each second power trace 109 may be connected to the source or drain of the transistor in the pixel unit 108. The second power trace may be configured to provide the second power signal for the transistor in the pixel unit 108. The second power signal may be a positive power signal, and the second power trace may also be referred to as a VDD power line or a VDD trace.

Figure 11:
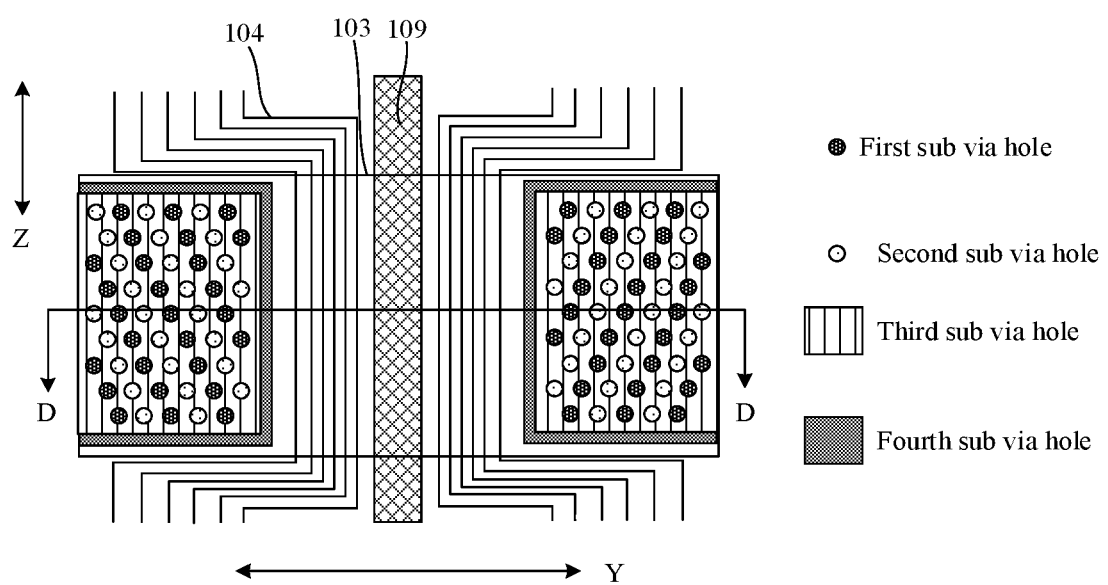
FIG. 11 is a partial schematic diagram of a region C of the display panel shown in FIG. 8.
Figure 12:
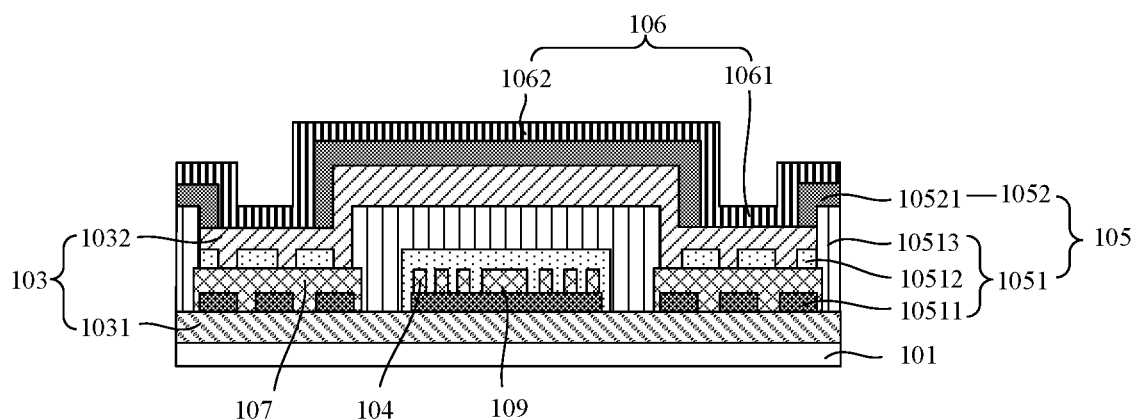
FIG. 12 is a sectional view of FIG. 11 along a DD direction.

FIG. 11 is a partial schematic diagram of a region C of the display panel shown in FIG. 9. FIG. 12 is a sectional view of FIG. 11 along a DD direction. With reference to FIG. 11 and FIG. 12, the orthographic projection of each second power trace 109 on the base substrate 101 is between two adjacent target regions, i.e., between the orthographic projections of two adjacent first via holes 105a on the base substrate 101. In an example embodiment, one second power trace 109 may be designed between the orthographic projections of every two adjacent first via holes 105a on the base substrate 101. The second power traces 109 may be integrated in the first fan-out region 101b11 and the second fan-out region 101b12.

Optionally, the length of the second power trace 109 in the second direction Y (i.e., the width of the second power trace 109) may be 100 μm. That is, the second power trace 109 may be narrower, which can facilitate the implementation of the narrow border of the display panel 10.

Referring to FIG. 12, the distance between the first part 1061 of the cathode layer 106 and the base substrate 101 is smaller than the distance between the second part 1062 of the cathode layer 106 and the base substrate 101. Here, the orthographic projection of the first part 1061 of the cathode layer 106 on the base substrate 101 is overlapped with a region where the orthographic projections of the first via holes 105a on the base substrate 101 are; and the orthographic projection of the second part 1062 of the cathode layer 106 on the base substrate 101 is overlapped with a region where the orthographic projections of the signal lines 104 on the base substrate 101 are.

Figure 13:
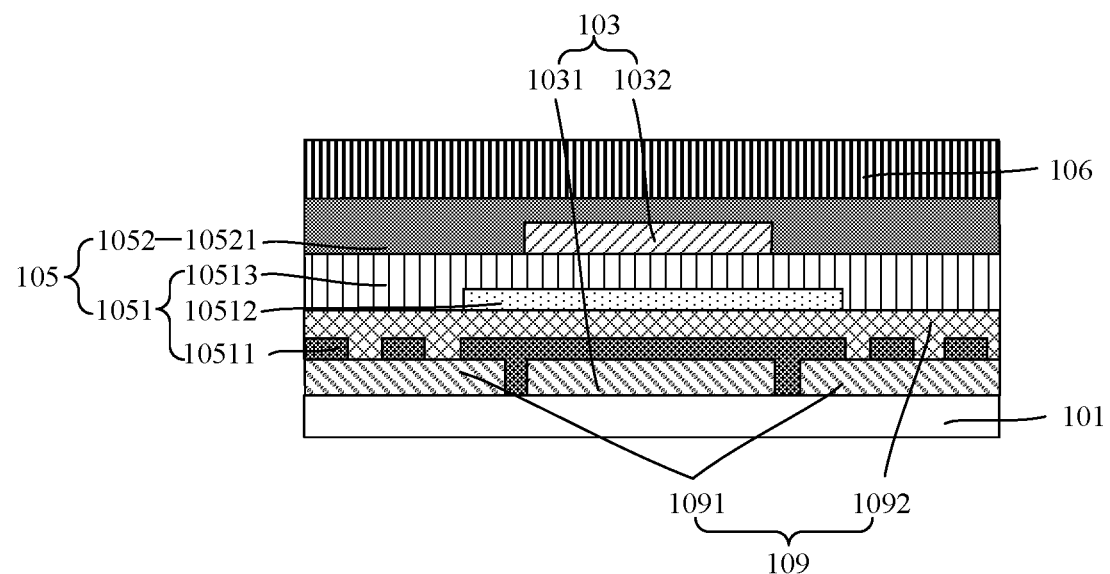
FIG. 13 is a sectional view of the display panel shown in FIG. 9 along an EE direction.

FIG. 13 is a sectional view of the display panel shown in FIG. 9 along an EE direction. Referring to FIG. 13, the second power trace 109 may include a third sub-trace 1091 and a fourth sub-trace 1092 which are sequentially laminated in the direction distal from the base substrate 101. Both the third sub-trace 1091 and the fourth sub-trace 1092 extend in the third direction Z.

Optionally, the third sub-trace 1091 is disposed in the same layer as the first sub-trace 1031 in the connecting trace 103, and the fourth sub-trace 1092 is disposed in the same layer as the transfer structure 107. That is, the third sub-trace 1091 and the first sub-trace 1031 may be made of the same material by the same patterning process, and the fourth sub-trace 1092 and the transfer structure 107 may be made of the same material by the same patterning process.

Since the first sub-insulating layer 10511 is disposed between the first sub-trace 1031 and the transfer structure 107, the first sub-insulating layer 10511 is also disposed between the third sub-trace 1091 and the fourth sub-trace 1092. Thus, referring to FIG. 13, a plurality of sixth sub via holes (not shown in the figure) may be further formed in the first sub-insulating layer 10511, and the third sub-trace 1091 is electrically connected to the fourth sub-trace 1092 through the plurality of sixth sub via holes.

In the embodiments of the present disclosure, since the extending direction (the third direction Z) of the third sub-trace 1091 intersects the extending direction (the second direction Y) of the first sub-trace 1031, and the third sub-trace 1091 and the first sub-trace 1031 are disposed in the same layer, in order to insulate the third sub-trace 1091 from the first sub-trace 1031, the orthogonal projection of the third sub-trace 1091 on the base substrate 101 may be not overlapped with the orthogonal projection of the first sub-trace 1031 on the base substrate 101.

In an example embodiment, the region where the orthographic projection of the first sub-trace 1031 on the base substrate 101 is disposed may be provided with only the fourth sub-trace 1092 and without the third sub-trace 1091. That is, the third sub-trace 1091 may be divided into two parts by the first sub-trace 1031, one part of the third sub-trace 1091 is disposed on the side of the first sub-trace 1031 close to the display region 101a, and the other part of the third sub-trace 1091 is disposed on the side of the first sub-trace 1031 distal from the display region 101a. The two parts of the third sub-trace 1091 are electrically connected to the fourth sub-trace 1092 through the sixth sub via holes in the first sub-insulating layer 10511.

In the embodiments of the present disclosure, referring to FIG. 2, the peripheral region 101b may include a first region 101b1 and a second region 101b2. The first region 101b1 and the second region 101b2 are on the two sides of the display region 101a, respectively.

Figure 14:
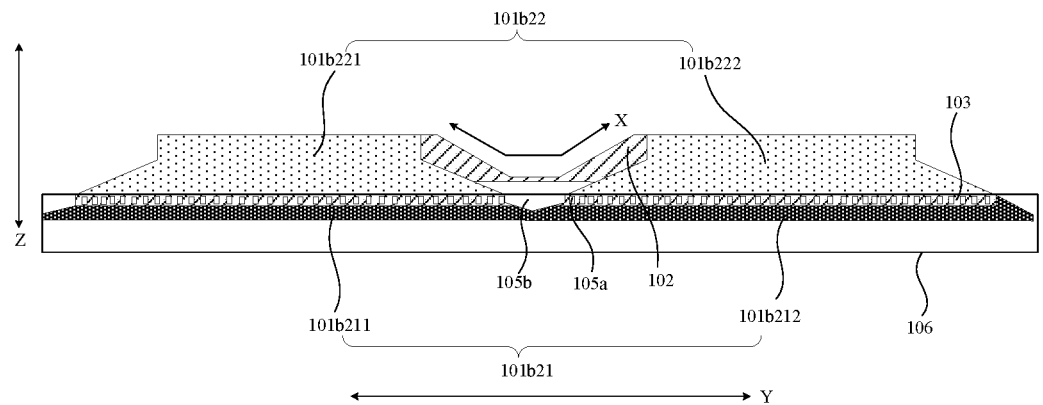
FIG. 14 is a schematic structural diagram of a second region of a display panel according to an embodiment of the present disclosure.

Referring to FIG. 8, it can be seen that the first region 101b1 includes a first fan-out region 101b11 and a second fan-out region 101b12 arranged along the third direction Z. The first fan-out region 101b11 is closer to the display region 101a than the second fan-out region 101b12 is. FIG. 14 is a schematic structural diagram of a second region of a display panel according to an embodiment of the present disclosure. Referring to FIG. 14, the second region 101b2 includes a third fan-out region 101b21 and a fourth fan-out region 101b22 arranged along the third direction Z. The third fan-out region 101b21 is closer to the display region 101a than the fourth fan-out region 101b22 is.

Optionally, the third fan-out region 101b21 and the first fan-out region 101b11 are disposed symmetrically about the central axis of the base substrate 101. The fourth fan-out region 101b22 and the second fan-out region 101b12 are disposed symmetrically about the central axis of the base substrate 101. Here, the central axis of the base substrate 101 is parallel to the second direction Y.

Optionally, the orthographic projections of part of the first via holes 105a on the base substrate 101 are within the first fan-out region 101b11, and are closer to the second fan-out region 101b12 than the display region 101a is. The orthographic projections of the other part of the first via holes 105a on the base substrate 101 are within the third fan-out region 101b21, and are closer to the fourth fan-out region 101b22 than the display region 101a is.

In the embodiments of the present disclosure, the display panel 10 may include a plurality of first power traces 102. The orthographic projections of part of the first power traces 102 on the base substrate 101 are within the first region 101b1, and the orthographic projections of the other part of the first power traces 102 on the base substrate 101 are within the second region 101b2. In addition, the display panel 10 may include two connecting traces 103. The orthographic projection of one connecting trace 103 on the base substrate 101 is within the first region 101b1, and the orthographic projection of the other connecting trace 103 on the base substrate 101 is within the second region 101b2. The first power traces 102 disposed in the first region 101b1 are electrically connected to the connecting trace 103 disposed in the first region 101b1, and the first power traces 102 disposed in the second region 101b2 are electrically connected to the connecting trace 103 disposed in the second region 101b2.

Optionally, the orthographic projection of the cathode layer 106 on the base substrate 101 may be in the first fan-out region 101b11 of the first region 101b1 and in the third fan-out region 101b21 of the second region 101b2. The part of the cathode layer 106 disposed in the first fan-out region 101b11 is electrically connected to the connecting trace 103 disposed in the first region 101b11 through the plurality of first via holes 105a disposed in the first fan-out region 101b11, and the part of the cathode layer 106 disposed in the third fan-out region 101b21 is electrically connected to the connecting trace 103 disposed in the second region 101b2 through the plurality of first via holes 105a disposed in the third fan-out region 101b21.

That is, the cathode layer 106 may receive the first power signals from the first power traces 102 in the first region 101b1 and the first power traces 102 in the second region 101b2, which ensures the reliability of receiving the first power signals by the cathode layer 106.

Figure 15:
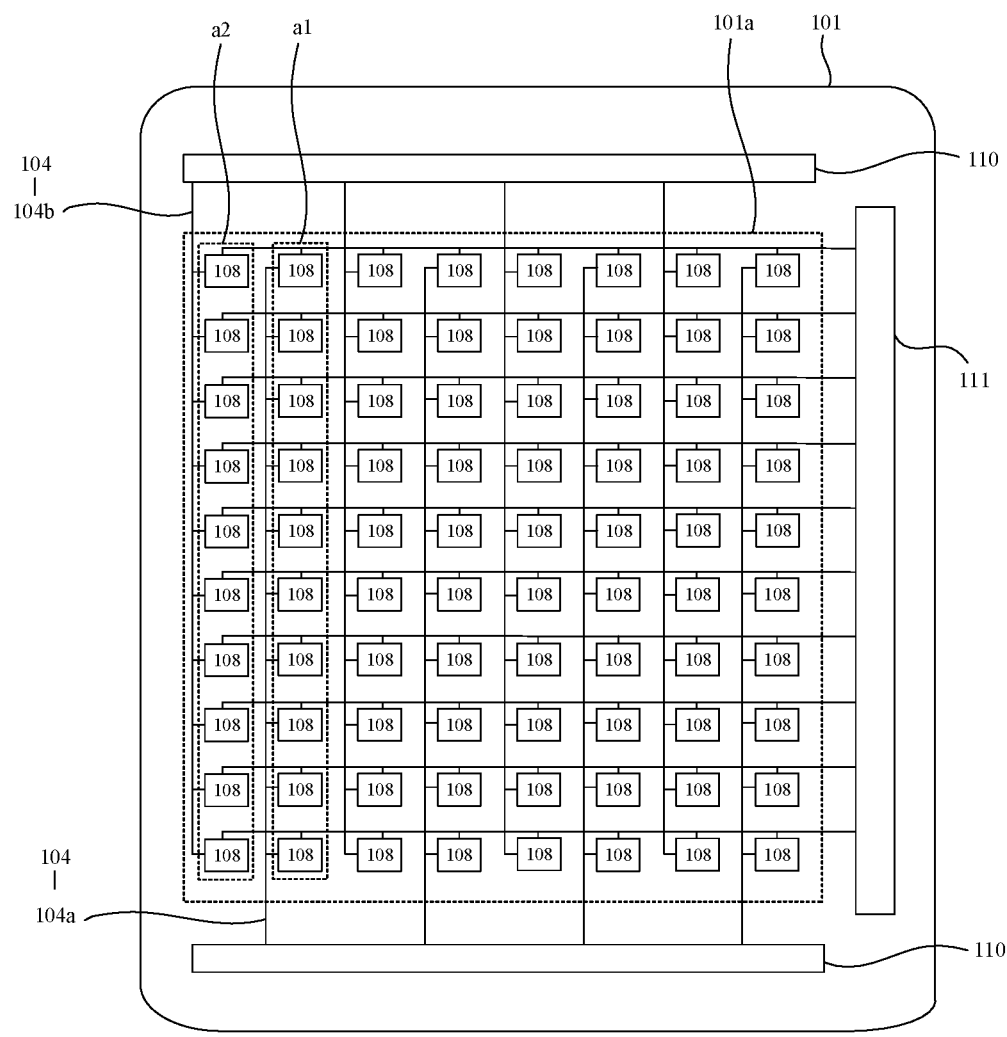
FIG. 15 is a schematic structural diagram of signal lines and pixel units according to an embodiment of the present disclosure.

FIG. 15 is a schematic structural diagram of signal lines and pixel units according to an embodiment of the present disclosure. Referring to FIG. 15, the signal lines 104 in the display panel 10 include a plurality of first-type signal lines 104a and a plurality of second-type signal lines 104b. The plurality of pixel units 108 in the display panel may be divided into a plurality of first pixel unit groups a1 and a plurality of second pixel unit groups a2. Each first pixel unit group a1 includes a plurality of first-type pixel units 108 arranged along the third direction Z, and each second pixel unit group a2 includes a plurality of second-type pixel units 108 arranged along the third direction Z.

Here, one end of each first-type signal line 104a is disposed in the first region 101b1, and is configured to receive a driving signal; and the other end of the first-type signal line 104a is disposed in the display region 101a, is electrically connected to the plurality of first-type pixel units 108 in one first pixel unit group a1, and provides the driving signal for the plurality of first-type pixel units 108 in the first pixel unit group a1. One end of each second-type signal line 104b is disposed in the second region 101b2, and is configured to receive the driving signal; and the other end of the second-type signal line 104b is disposed in the display region 101a, is electrically connected to the plurality of second-type pixel units 108 in one second pixel unit group a2, and is configured to provide the driving signal for the plurality of second-type pixel units 108 in the second pixel unit group a2.

In a display panel with a requirement of a higher pixels per inch (PPI), the first-type signal line 104a in the first region 101b1 and the second-type signal line 104b in the second region 101b2 respectively provide the driving signals for the pixel units 108 in the display panel, to prevent the plurality of signal lines 104 disposed in the same region from mutual influence due to the shorter distance therebetween.

Optionally, referring to FIG. 15, the first pixel unit groups a1 and the second pixel unit groups a2 are arranged at intervals. In an example embodiment, each of the first pixel unit group a1 and the second pixel unit group a2 includes a column of pixel units 108. In addition, in two adjacent columns of pixel units 108, one column of pixel units 108 are electrically connected to the first-type signal line 104a, and the other column of pixel units 108 are electrically connected to the second-type signal line 104b.

Referring to FIG. 15, the display panel 10 may include two source driving circuits 110 and a gate driving circuit 111. The first source driving circuit 110 is disposed in the first region 101b1, and the second source driving circuit 110 is disposed in the second region 101b2.

The first source driving circuit 110 is electrically connected to the first-type signal line 104a, and may transmit the driving signal to the first-type pixel units 108 in the first pixel unit group a1 through the first-type signal line 104a. The second source driving circuit 110 is electrically connected to the second-type signal line 104b, and may transmit the driving signal to the second-type pixel units 108 in the second pixel unit group a2 through the second-type signal line 104b.

The gate driving circuit 111 may be disposed on a side of the display region 101a. The gate driving circuit 111 may be electrically connected to each row of pixel units 108, and is configured to provide a gate driving signal for each row of pixel units 108.

Optionally, both the source driving circuit 110 and the gate driving circuit 111 may be connected to the pixel units 108 through a chip on film (COF).

Figure 16:
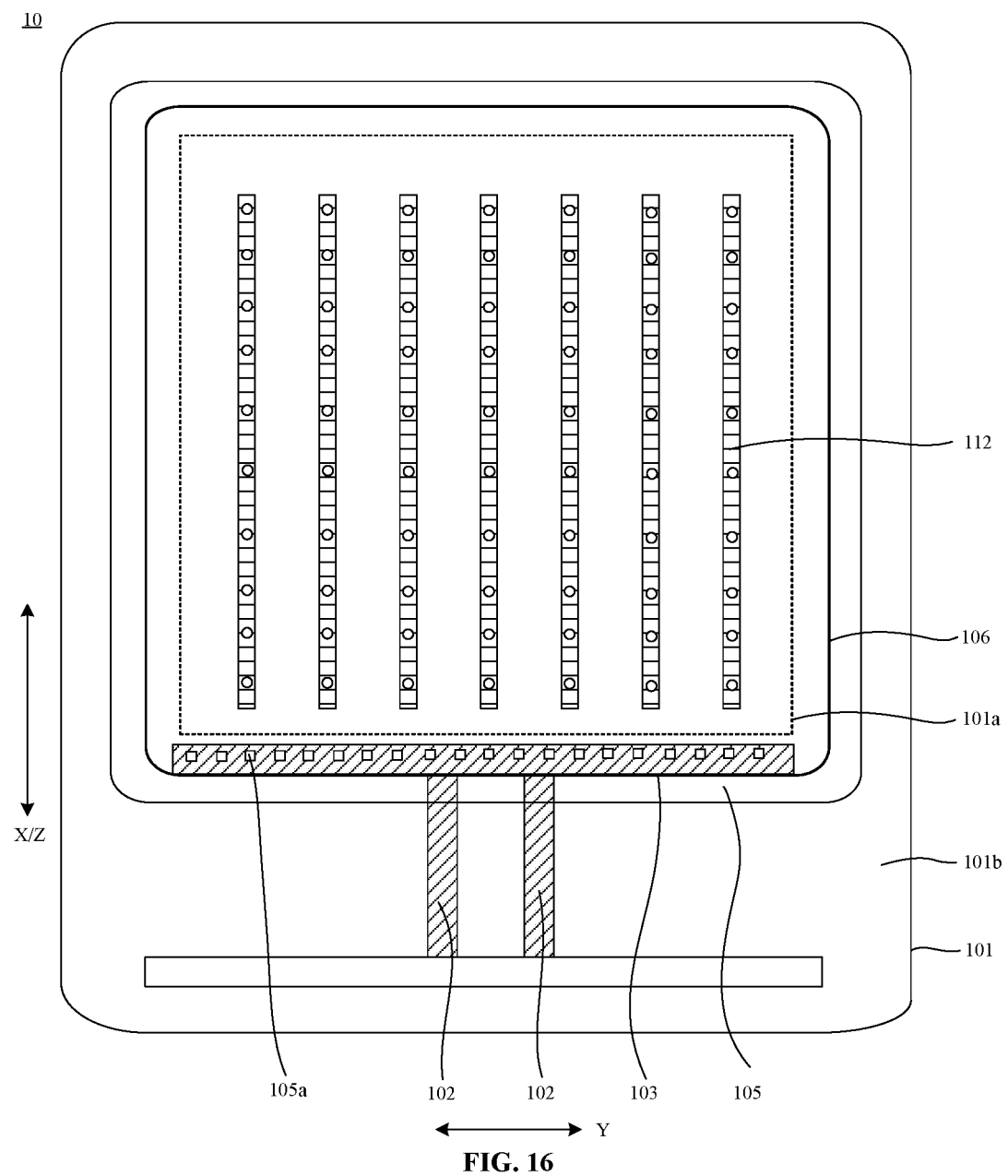
FIG. 16 is a schematic structural diagram of still another display panel according to an embodiment of the present disclosure.

FIG. 16 is a schematic structural diagram of still another display panel according to an embodiment of the present disclosure. Referring to FIG. 16, the display panel 10 may further include a plurality of auxiliary electrode structures 112 disposed in the display region 101a and extending in the third direction Z. The auxiliary electrode structures 112 are electrically connected to the cathode layer 106. In FIG. 16, the third direction Z is parallel to the first direction X, which is represented by X/Z.

By providing the auxiliary electrode structures 112, the IR drop of the cathode layer 106 in the third direction Z can be reduced, thereby improving the display effect of the display panel 10.

Optionally, the auxiliary electrode structures 112 may be disposed in the same layer as the source and drain layers of the transistors of the pixel units 108. That is, the auxiliary electrode structures 112 and the source and drain layers may be made of the same material by the same patterning process. In addition, a third via hole may be formed in the insulating layer 105, and the auxiliary electrode structure 112 is electrically connected to the cathode layer 106 through the third via hole.

In the embodiments of the present disclosure, the display panel 10 may be a top-emitting display panel. The cathode layer 106 in the top-emitting display panel may be made of a material with a higher transmittance. For example, the material of the cathode layer 106 may be indium zinc oxide (IZO). Here, the cathode layer 106 made of the material with the higher transmittance usually has a big impedance, and the cathode layer 106 has a larger IR drop, which may affect the display uniformity of regions of the display panel, resulting in a poorer display effect of the display panel.

In the embodiments of the present disclosure, the plurality of first via holes 105*a* arranged in the second direction Y are formed in the insulating layer 105, so as to improve the uniformity of the first power signals received by the cathode layer 106 in all regions along the second direction Y. In addition, by providing the auxiliary electrode structures 112 extending along the third direction Z in the display panel 10, the uniformity of the first power signals received by the cathode layer 106 in all regions in the third direction Z is improved. That is, the IR drop of the cathode layer 106 in the display panel 10 provided by the embodiments of the present disclosure is lower, which can ensure the display uniformity of all regions of the display panel 10. Therefore, the display panel has a good display effect.

In summary, the embodiment of the present disclosure provides a display panel. The orthographic projections of parts, disposed in the peripheral region, of the plurality of signal lines in the display panel on the base substrate enclose the plurality of target regions arranged along the second direction. Thus, the plurality of first via holes arranged along the second direction may be formed in the insulating layer, such that the connecting trace can transmit the first power signals received from the first power traces to the cathode layer through the first via holes. Therefore, the uniformity of the first power signals received in the regions of the cathode layer in the second direction is improved, and the display effect of the display panel is better.

Figure 17:
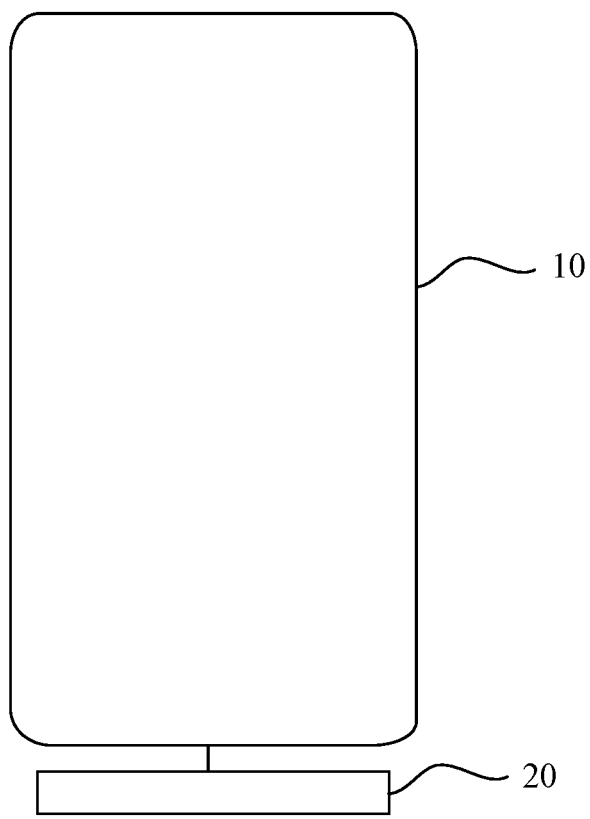
FIG. 17 is a schematic structural diagram of a display device according to an embodiment of the present disclosure.

FIG. 17 is a schematic structural diagram of a display device according to an embodiment of the present disclosure. Referring to FIG. 17, the display device may include a power supply assembly 20 and the display panel 10 described in the above embodiments. The power supply assembly 20 may be configured to supply power to the display panel 10. Here, the display device may be a curved display device.

Optionally, the display device may be an organic light-emitting diode (OLED) display panel, an electronic paper, a mobile phone, a tablet computer, a TV, a display, a notebook computer, a digital photo frame, a navigator, or any other product or component having a display function.

Described above are merely optional embodiments of the present disclosure, and are not intended to limit the present disclosure. Any modifications, equivalent substitutions, improvements and the like made within the spirit and principles of the present disclosure should be included within the scope of protection of the present disclosure.

What is claimed is:

1. A display panel, comprising:
   a base substrate, comprising a display region and a peripheral region adjacent to the display region;
   a first power trace, disposed in the peripheral region and on a side of the base substrate, wherein the first power trace is extended along a first direction and configured to receive a first power signal;
   a connecting trace, disposed in the peripheral region and on a side of the base substrate, wherein the connecting trace is electrically connected to the first power trace and extended along a second direction, the second direction intersecting the first direction;
   a plurality of signal lines, disposed in the display region and the peripheral region, wherein orthographic projections of parts, disposed in the peripheral region, of the plurality of signal lines on the base substrate enclose a plurality of target regions arranged along the second direction, and an orthographic projection of the connecting trace on the base substrate is at least partially overlapped with the plurality of target regions;
   an insulating layer, disposed in the display region and the peripheral region, wherein the insulating layer is disposed on a side, distal from the base substrate, of the connecting trace, and the insulating layer is provided with a plurality of first via holes arranged along the second direction; the plurality of first via holes being in one-to-one correspondence with the plurality of target regions, and an orthographic projection of the first via hole on the base substrate being within one corresponding target region; and
   a cathode layer, disposed in the display region and the peripheral region, wherein the cathode layer is disposed on a side, distal from the base substrate, of the insulating layer, and the cathode layer is electrically connected to the connecting trace through the plurality of first via holes.

2. The display panel according to claim 1, wherein a number of the target regions is less than a number of the signal lines.

3. The display panel according to claim 1, wherein
   a distance between a first part of the cathode layer and the base substrate is shorter than a distance between a second part of the cathode layer and the base substrate,
   wherein an orthographic projection of the first part of the cathode layer on the base substrate is overlapped with a region where the orthographic projections of the first via holes on the base substrate are; and an orthographic projection of the second part of the cathode layer on the base substrate is overlapped with a region where the orthographic projections of the signal lines on the base substrate are.

4. The display panel according to claim 1, wherein the plurality of target regions comprise: a first target region, a second target region adjacent to the first target region along the second direction, a third target region, and a fourth target region adjacent to the third target region along the second direction,
   wherein a number of the signal lines between the first target region and the second target region is the same as a number of the signal lines between the third target region and the fourth target region.

5. The display panel according to claim 1, wherein each of the signal lines at least comprises: a first line segment, a second line segment and a third line segment which are sequentially connected; wherein
   both the first line segment and the third line segment are extended along the second direction, and the second line segment is extended along a third direction, the third direction intersecting the second direction; and
   an orthographic projection of the first line segment on the base substrate is on a side, close to the display region, of the orthographic projections of the plurality of first via holes on the base substrate, an orthographic projection of the third line segment on the base substrate is on a side, distal from the display region, of the orthographic projections of the plurality of first via holes on the base substrate, and an orthographic projection of the second line segment on the base substrate is between the orthographic projections of two adjacent first via holes on the base substrate.

6. The display panel according to claim 1, wherein the connecting trace comprises a first sub-trace and a second sub-trace which are sequentially laminated along a direction distal from the base substrate, the first sub-trace and the second sub-trace being extended along the second direction; the insulating layer comprises a first insulating layer group and a second insulating layer group; and each first via hole comprises a first via hole group and a second via hole group, the first via hole group being in the first insulating layer group, and the second via hole group being in the second insulating layer group;

wherein the first insulating layer group is disposed between the first sub-trace and the second sub-trace, and the second insulating layer group is disposed on a side, distal from the base substrate, of the second sub-trace; and the first sub-trace is electrically connected to the second sub-trace through the first via hole group, and the second sub-trace is electrically connected to the cathode layer through the second via hole group.

7. The display panel according to claim 6, further comprising: a transfer structure disposed between the first sub-trace and the second sub-trace; the first insulating layer group comprises: a first sub-insulating layer, a second sub-insulating layer and a third sub-insulating layer which are sequentially laminated along the direction distal from the base substrate; the first via hole group comprises: a plurality of first sub via holes, a plurality of second sub via holes and one third sub via hole, wherein the plurality of first sub via holes are in the first sub-insulating layer, the plurality of second sub via holes are in the second sub-insulating layer, and the third sub via hole is in the third sub-insulating layer; and the first sub-insulating layer is disposed between the first sub-trace and the transfer structure, and the second sub-insulating layer and the third sub-insulating layer are disposed between the transfer structure and the second sub-trace; and the first sub-trace is electrically connected to the transfer structure through the plurality of first sub via holes, and the transfer structure is electrically connected to the second sub-trace through the plurality of second sub via holes and the third sub via hole.

8. The display panel according to claim 1, wherein the peripheral region comprises a first region, the first region being on a side of the display region and the first region comprising a first fan-out region and a second fan-out region arranged along a third direction, wherein the first fan-out region is closer to the display region than the second fan-out region is, the third direction intersecting the second direction, wherein the orthographic projections of the plurality of first via holes on the base substrate are within the first fan-out region and are closer to the second fan-out region than the display region is.

9. The display panel according to claim 8, wherein the first fan-out region comprises a first fan-out sub-region and a second fan-out sub-region arranged along the second direction, and the plurality of first via holes comprise a plurality of first-type via holes and a plurality of second-type via holes, wherein orthographic projections of the plurality of first-type via holes on the base substrate are within the first fan-out sub-region, and orthographic projections of the plurality of second-type via holes on the base substrate are within the second fan-out sub-region; and the plurality of first-type via holes and the plurality of second-type via holes are disposed symmetrically about a symmetry axis, extending along the third direction, of the base substrate.

10. The display panel according to claim 9, wherein the second fan-out region comprises a third fan-out sub-region and a fourth fan-out sub-region which are arranged along the second direction; and the insulating layer is further provided with a second via hole, and the cathode layer is electrically connected to the connecting trace through the second via hole, wherein an orthographic projection of the second via hole on the base substrate is between the first fan-out sub-region and the second fan-out sub-region and between the third fan-out sub-region and the fourth fan-out sub-region, and a size of the second via hole is greater than a size of the first via hole.

11. The display panel according to claim 8, wherein parts, disposed in the first fan-out region, of the plurality of signal lines are disposed in a same layer as the transfer structure in the display panel, and parts, disposed in the second fan-out region, of the plurality of signal lines are disposed in a same layer as the first sub-trace in the connecting trace.

12. The display panel according to claim 11, wherein a first sub-insulating layer in the insulating layer is provided with a plurality of fifth sub via holes; and the part, disposed in the first fan-out region, of each of the signal lines is electrically connected to the part, disposed in the second fan-out region, of the signal line through at least one fifth sub via hole.

13. The display panel according to claim 1, further comprising: a plurality of second power traces extending along a third direction, wherein the plurality of second power traces are disposed on a side of the base substrate, and the third direction intersects the second direction; and one end of each of the second power traces is electrically connected to transistors in a plurality of pixel units in the display panel, and the other end of the second power trace is configured to receive a second power signal.

14. The display panel according to claim 13, wherein an orthographic projection of each of the second power traces on the base substrate is between two adjacent target regions.

15. The display panel according to claim 13, wherein the second power trace comprises a third sub-trace and a fourth sub-trace which are sequentially laminated along a direction distal from the base substrate and extended along the third direction; the third sub-trace being disposed in a same layer as a first sub-trace in the connecting trace, and the fourth sub-trace being disposed in a same layer as a transfer structure in the display panel; and a first sub-insulating layer in the insulating layer is further provided with a plurality of sixth sub via holes, and the third sub-trace is electrically connected to the fourth sub-trace through the plurality of sixth sub via holes.

16. The display panel according to claim 1, wherein the peripheral region comprises a first region and a second region, the first region and the second region being on two sides of the display region respectively; wherein the first region comprises a first fan-out region and a second fan-out region which are arranged along a third direction, wherein the first fan-out region is closer to the display region than the second fan-out region is; and the second region comprises a third fan-out region and a fourth fan-out region which are arranged along the third direction, wherein the third fan-out region is closer to the display region than the fourth fan-out region is, the third direction intersecting the second direction, wherein the orthographic projections of part of the first via holes on the base substrate are within the first fan-out region and are closer to the second fan-out region than the display region is; and the orthographic projections of the other part of the first via holes on the base substrate are within the third fan-out region and are closer to the fourth fan-out region than the display region is.

17. The display panel according to claim 16, wherein the plurality of signal lines comprise a plurality of first-type signal lines and a plurality of second-type signal lines;

the display panel further comprising: a plurality of pixel units, the plurality of pixel units comprising a plurality of first pixel unit groups and a plurality of second pixel unit groups, wherein each of the first pixel unit groups comprises a plurality of first-type pixel units arranged along the third direction, and each of the second pixel unit groups comprises a plurality of second-type pixel units arranged along the third direction;

wherein one end of each of the first-type signal lines is disposed in the first region and is configured to receive a driving signal, and the other end of the first-type signal line is disposed in the display region and is configured to provide the driving signal for the plurality of first-type pixel units in one first pixel unit group; and wherein one end of each of the second-type signal lines is disposed in the second region and is configured to receive the driving signal, and the other end of the second-type signal line is disposed in the display region and is configured to provide the driving signal for the plurality of second-type pixel units in one second pixel unit group.

18. The display panel according to claim 1, wherein the first power trace and the connecting trace are disposed in a same layer.

19. The display panel according to claim 1, further comprising: a plurality of auxiliary electrode structures disposed in the display region and extended along a third direction, the third direction intersecting the second direction;

wherein the plurality of auxiliary electrode structures are electrically connected to the cathode layer.

20. A display device, comprising: a power supply assembly and a display panel, wherein the display panel comprises:
a base substrate, comprising a display region and a peripheral region adjacent to the display region;
a first power trace, disposed in the peripheral region and on a side of the base substrate, wherein the first power trace is extended along a first direction and configured to receive a first power signal;
a connecting trace, disposed in the peripheral region and on a side of the base substrate, wherein the connecting trace is electrically connected to the first power trace and extended along a second direction, the second direction intersecting the first direction;
a plurality of signal lines, disposed in the display region and the peripheral region, wherein orthographic projections of parts, disposed in the peripheral region, of the plurality of signal lines on the base substrate enclose a plurality of target regions arranged along the second direction, and an orthographic projection of the connecting trace on the base substrate is at least partially overlapped with the plurality of target regions;
an insulating layer, disposed in the display region and the peripheral region, wherein the insulating layer is disposed on a side, distal from the base substrate, of the connecting trace, and the insulating layer is provided with a plurality of first via holes arranged along the second direction; the plurality of first via holes being in one-to-one correspondence with the plurality of target regions, and an orthographic projection of the first via hole on the base substrate being within one corresponding target region; and
a cathode layer, disposed in the display region and the peripheral region, wherein the cathode layer is disposed on a side, distal from the base substrate, of the insulating layer, and the cathode layer is electrically connected to the connecting trace through the plurality of first via holes;
and, the power supply assembly is configured to supply power to the display panel.

* * * * *